United States Patent
Chan et al.

(10) Patent No.: US 12,260,315 B2
(45) Date of Patent: Mar. 25, 2025

(54) DEVICE, METHOD AND STORAGE MEDIUM FOR ACCELERATING ACTIVATION FUNCTION

(71) Applicant: HON HAI PRECISION INDUSTRY CO., LTD., New Taipei (TW)

(72) Inventors: Ta-Wei Chan, New Taipei (TW); Hung-Wen Lin, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 947 days.

(21) Appl. No.: 17/354,422

(22) Filed: Jun. 22, 2021

(65) Prior Publication Data
US 2021/0397928 A1 Dec. 23, 2021

(30) Foreign Application Priority Data
Jun. 22, 2020 (CN) .......................... 202010574536.X

(51) Int. Cl.
| | | |
|---|---|---|
| G06N 3/048 | (2023.01) | |
| G06F 7/02 | (2006.01) | |
| G06F 7/50 | (2006.01) | |
| G06F 7/523 | (2006.01) | |
| H03K 19/21 | (2006.01) | |

(52) U.S. Cl.
CPC ............... G06N 3/048 (2023.01); G06F 7/02 (2013.01); G06F 7/50 (2013.01); G06F 7/523 (2013.01); H03K 19/21 (2013.01)

(58) Field of Classification Search
CPC .. G06F 7/02; G06F 7/50; G06F 7/523; G06N 3/048; H03K 19/21
USPC ............................................................. 327/167
See application file for complete search history.

(56) References Cited

U.S. PATENT DOCUMENTS

| 11,475,305 B2 * | 10/2022 | Loh .......................... G06F 30/30 |
| 2021/0133565 A1 * | 5/2021 | Shamir ....................... G06N 3/04 |
| 2022/0027713 A1 * | 1/2022 | Huang .................... G06N 3/063 |

(Continued)

FOREIGN PATENT DOCUMENTS

| CN | 108898216 | 11/2018 |
| JP | H05282441 | 10/1993 |

OTHER PUBLICATIONS

Jingming Yang et al., Hardware implementation and improvement of BP neural network based on FPGA, Computer Engineering and Design, vol. 39, Issue 6, Jun. 2018, pp. 1733-1738.

*Primary Examiner* — William Hernandez
(74) *Attorney, Agent, or Firm* — ScienBiziP, P.C.

(57) ABSTRACT

A device, a method and a storage medium for accelerating activation function in relation to data processing by artificial neural network provides a register for storing a storage table, a matching unit including a plurality of comparators, a logic unit, and a selection unit. The comparators compare an input variable of the activation function with the variable intervals of the activation function to obtain a comparison output result, the logic unit performs a logical operation according to the comparison output result to obtain a logic output result and determines a variable interval to be calculated according to the logic output. The selection unit queries the storage table according to the variable interval to be calculated and obtains parameters of fitted quadratic function. A calculation unit performs calculations on the input variable according to the parameters.

20 Claims, 6 Drawing Sheets

(56) References Cited

U.S. PATENT DOCUMENTS

2022/0230057 A1* 7/2022 Pasca ............... G06F 7/548
2024/0005138 A1* 1/2024 Boonstra ............ G06N 3/063

* cited by examiner

DEVICE, METHOD AND STORAGE MEDIUM FOR ACCELERATING ACTIVATION FUNCTION

FIELD

The present disclosure relates to a technical field of deep learning, specifically a device, a method and a storage medium for accelerating activation function.

BACKGROUND

The data processing of artificial neural network includes a convolution, a pooling, and an activation. The activation provides a nonlinear modeling of the capabilities of the neural network. Most existing activation functions include exponential operations and division operations, which lead to increased computational complexity and excessive time consumption.

DETAILED DESCRIPTION

The accompanying drawings combined with the detailed description illustrate the embodiments of the present disclosure hereinafter. It is noted that embodiments of the present disclosure and features of the embodiments can be combined, when there is no conflict.

Various details are described in the following descriptions for a better understanding of the present disclosure, however, the present disclosure may also be implemented in other ways other than those described herein. The scope of the present disclosure is not to be limited by the specific embodiments disclosed below.

Unless defined otherwise, all technical and scientific terms used herein have the same meaning as commonly understood by one of ordinary skill in the art to which the present disclosure belongs. The terms used herein in the present disclosure are only for the purpose of describing specific embodiments and are not intended to limit the present disclosure.

Figure 1:
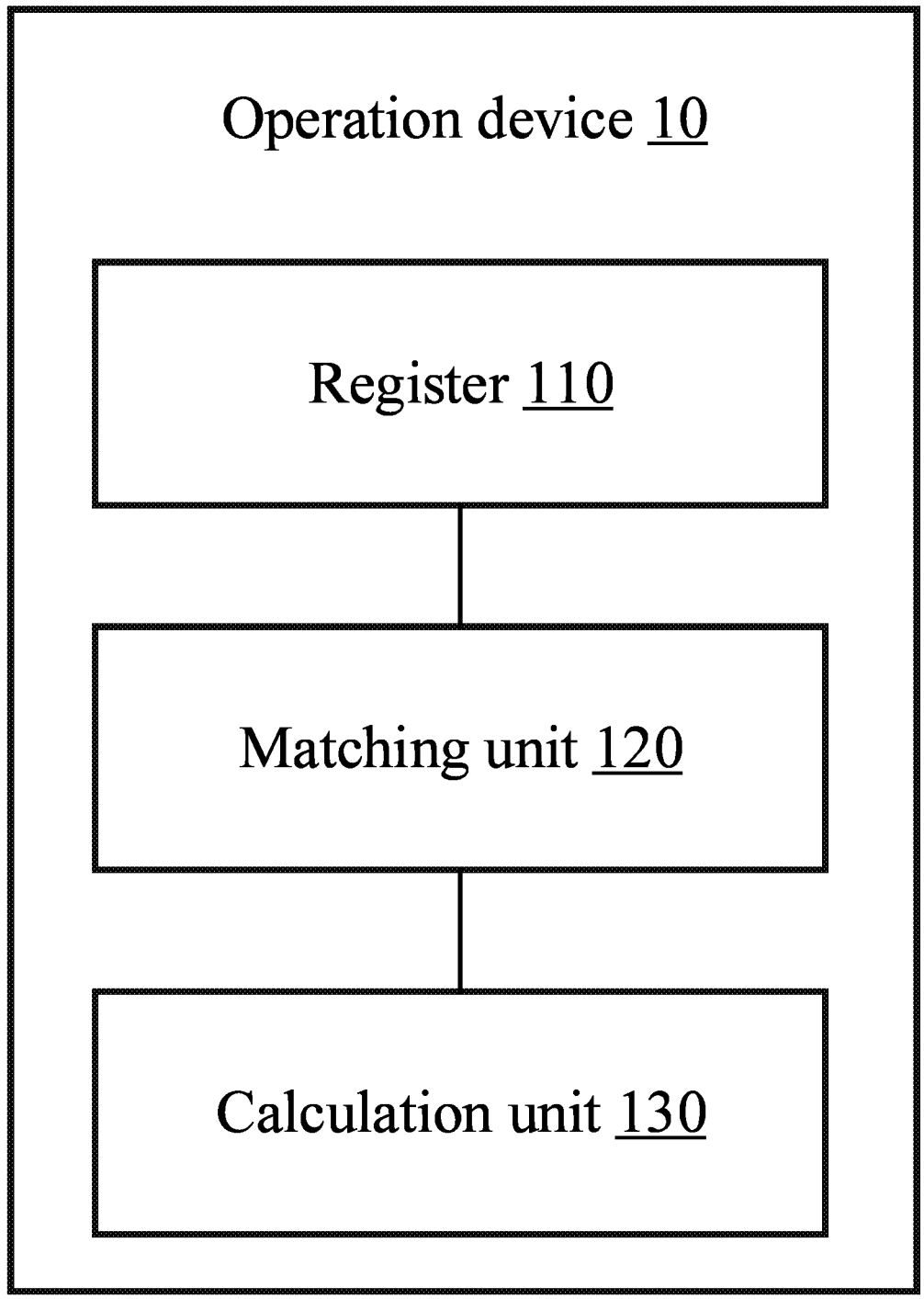
FIG. 1 shows a schematic structural diagram of a device for accelerating activation function provided in an embodiment of the present disclosure.

FIG. 1 shows a schematic structural diagram of a device for accelerating activation function provided in an embodiment of the present disclosure. For the convenience of description, the device for accelerating the activation function is referred to as "operation device 10" in the following. In an embodiment, an activation function of a neural network usually adopts a non-linear function. For example, a sigmoid function $$f(x) = \frac{1}{1+e^{-x}},$$

a function $f(x)=\tanh(x)$, a ReLU function $f(x)=\max(0,x)$. The non-linear activation function has a problem of slow execution speed when the neural network is in activation mode. In order to solve the above problem, in the present disclosure, the computationally complex nonlinear function is approximated by piecewise fitting of quadratic functions and a finite element method. Specifically, by dividing the activation function into N segments, each segment is approximated by the fitted quadratic function. Parameters of the fitted quadratic function corresponding to each segment are calculated and stored in a coefficient memory.

In an embodiment, the operation device 10 includes a register 110, a matching unit 120, and a calculation unit 130 connected to the matching unit 120. It should be noted that, although not shown, each unit in the operation device 10 may be uniformly clock-driven to ensure timing during processing. The register 110 includes a coefficient register, a segment register, and a configuration register. The coefficient register is used to store parameters of the fitted quadratic function used to fit the activation function. In an embodiment, the parameters include a quadratic coefficient a, a first coefficient b, and a constant c. The parameters can be used to uniquely determine an expression of the fitted quadratic function corresponding to a certain variable interval of the activation function. For example, if the activation function is divided into N segments, then N groups of parameters $(a_i, b_i, c_i)$ are stored in the coefficient register, where $1 \leq i \leq N$. A data type of the parameters is 32-bit floating point.

The segmentation register is used to store variables of the activation function after segmentation processing. For example, N variable intervals can be obtained by dividing the variables of the activation function into N parts. In an embodiment, there is a corresponding relationship between the coefficient register and the segment register. A fitted quadratic function constructed by the parameters stored in the coefficient register may represent an activation function corresponding to the variable intervals stored in the segmentation register.

The configuration register is used to configure the fitted quadratic function to apply various types of activation functions. In an embodiment, the configuration register includes an enabling unit. When an enable signal of the enabling unit is a high-level signal "1", a corresponding activation function is selected according to the activation function after segmentation processing stored in the segmented register. When an enable signal of the enabling unit is a low-level signal "0", it is confirmed that an output of the activation function is equal to an input of the activation function.

In an embodiment, the register 110 may also store a mapping relationship between variable intervals of the activation function and the parameters of the fitted quadratic function. The mapping relationship may be in a form of a storage table. The storage table can be the form of a register file, that is, each group of variable interval indexes and corresponding parameters of the fitted quadratic function are stored in the register. Using the register file for storage, a plurality of outputs of a look-up table can be connected to a plurality of comparators at the same time, thereby improving parallel processing of the operation device 10. The plurality of outputs include a plurality of variable intervals and corresponding parameters of the fitted quadratic function.

For example, in one embodiment, the storage table constructed based on the sigmoid function is shown in Table 1 below.

TABLE 1

| Variable intervals | Quadratic coefficients | First coefficient | Constant |
|---|---|---|---|
| [0, 1] | $a_1$ | $b_1$ | $c_1$ |
| [1, 2] | $a_2$ | $b_2$ | $c_2$ |
| ... | ... | ... | ... |
| [N-1, N] | $a_N$ | $b_N$ | $c_N$ |

In Table 1, there are N variable intervals, and each variable interval corresponds to a variable interval range of the activation function. The quadratic coefficient represents the quadratic coefficient of the quadratic function fitted to the activation function within the range of the corresponding variable interval. The first coefficient represents the first coefficient of the quadratic function fitted to the activation function within the range of the corresponding variable interval. The constant represents the constant of the quadratic function fitted to the activation function within the range of the corresponding variable interval. For example, the variable interval of the activation function in Table 1 is divided into a plurality of equally spaced segment intervals [0,1), [1,2) and so on. For example, when the variable interval is [0,1), the corresponding parameters of the fitted quadratic function are the quadratic coefficient $a_1$, the first coefficient $b_1$ and the constant $c_1$; when the variable interval is [1,2), the corresponding parameters of the fitted quadratic function are the quadratic coefficient are $a_2$, the first coefficient $b_2$ and the constant $c_2$.

It should be noted that the storage table can be constructed online or dynamically changed during the activation process. The stored table of the plurality of activation functions involved in the neural network can also be constructed offline. The stored table is stored in the register 110 to be dynamically read during the activation process. It is preferable to construct the stored table offline to improve an efficiency of activation processing.

The matching unit 120 is configured to determine the variable interval in which the input variable of the activation function falls according to the input variable and variable interval of the activation function, and then match the corresponding parameter of the fitted quadratic function according to the determined variable interval.

Figure 2:
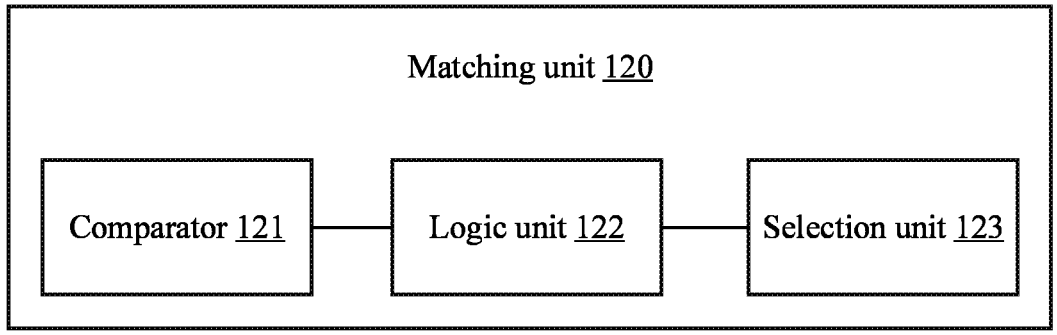
FIG. 2 shows schematic structural diagram of a matching unit in the device in an embodiment of the present disclosure.

Referring to FIG. 2, the matching unit 120 includes a plurality of comparators 121, a logic unit 122, and a selection unit 123. The plurality of comparators 121 is connected to the selection unit 123 through the logic unit 122. FIG. 2 shows N comparators, namely a comparator 1, a comparator 2, . . . , a comparator N−1.

In an embodiment, the comparator 121 is used to compare the input variable of the activation function with the variable intervals of the activation function, and determine an output value according to a magnitude relationship between them.

When an input variable x is less than a maximum variable $x_N$ in the corresponding variable interval, the comparator outputs a low level "0". When the input variable x is greater than or equal to the maximum variable $x_N$ in the corresponding variable interval, the comparator outputs a high level "1".

Figure 3:
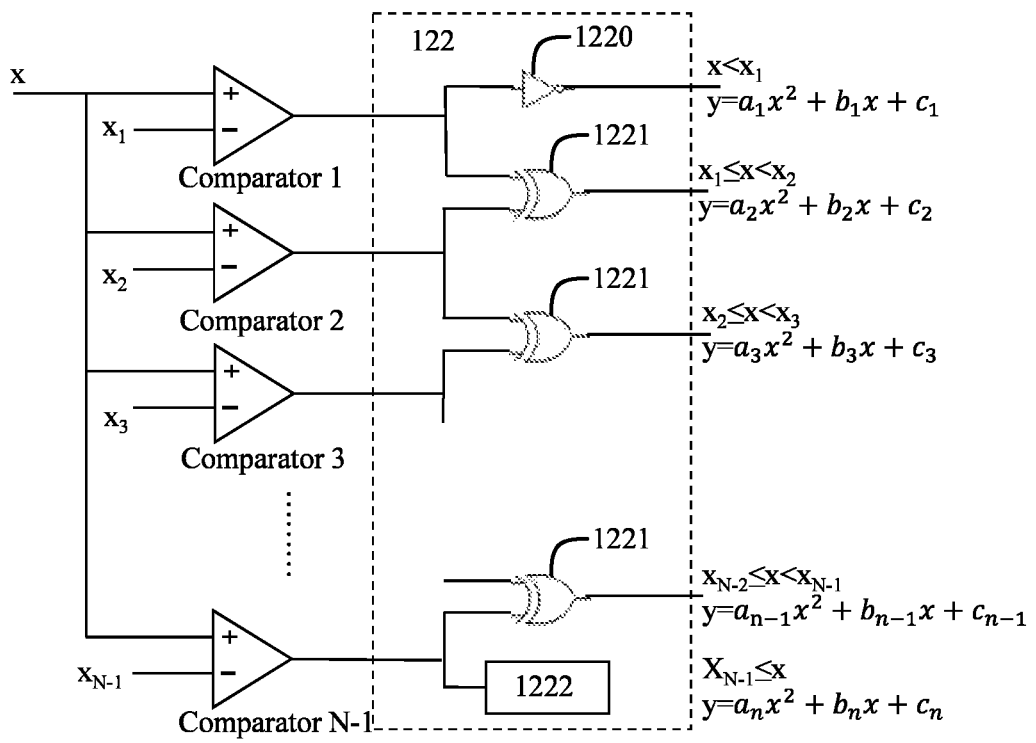
FIG. 3 shows schematic structural diagram of a logic unit in the device in an embodiment of the present disclosure.

The logic unit 122 includes a NOT gate 1220, a plurality of XOR gates 1221, and a buffer unit 1222. For example, as shown in FIG. 3, an output of the comparator 1 is connected to the NOT gate and an XOR gate 1 of the logic unit 122; an output of the comparator 2 is connected to the XOR gate 1 and an XOR gate 2; an output of the comparator 3 is connected to the XOR gate 2 and an XOR gate 3, and so on; an output of the comparator N−2 is connected to an XOR gate N−3 and an XOR gate N−2; an output of the comparator N−1 is connected to the XOR gate N−2 and a buffer unit 1222. When the input variable is greater than maximum values of all variable intervals, an output result of the comparator N−1 is input directly to the buffer unit 1222.

For example, one input of the comparator 2 is used to receive the input variable of the activation function, and the other input is used to receive a maximum value $x_2$ of the interval variable [1,2), and $x_2$ approaches 2. For example, when the input variable is 1.5, since 1.5 is greater than 1, the comparator 1 outputs a high level "1", and since 1.5 is less than 2, the comparator 2 outputs a low level "0". Similarly, since 1.5 is less than a maximum value of other interval variable, other comparator also outputs a low level "0". The comparator 1 outputs a low level "0" after passing through the NOT gate of the logic unit, while the output of the comparator 1 and the output of the comparator 2 are a high level "1" after being processed by the XOR gate of the logic unit. After the output of the comparator 2 and the output of the comparator 3 pass through the XOR gate of the logic unit, a low level "0" is output, and so on. After the output of the comparator N−2 and the output of the comparator N−1 pass through the XOR gate of the logic unit, a low level "0" is output. Therefore, the selection unit selects the parameters ($a_2$, $b_2$, $c_2$) of the fitted quadratic function corresponding to the variable interval [1,2). The parameters selected by the selection unit 123 are then output to the connected calculation unit 130.

Figure 4:
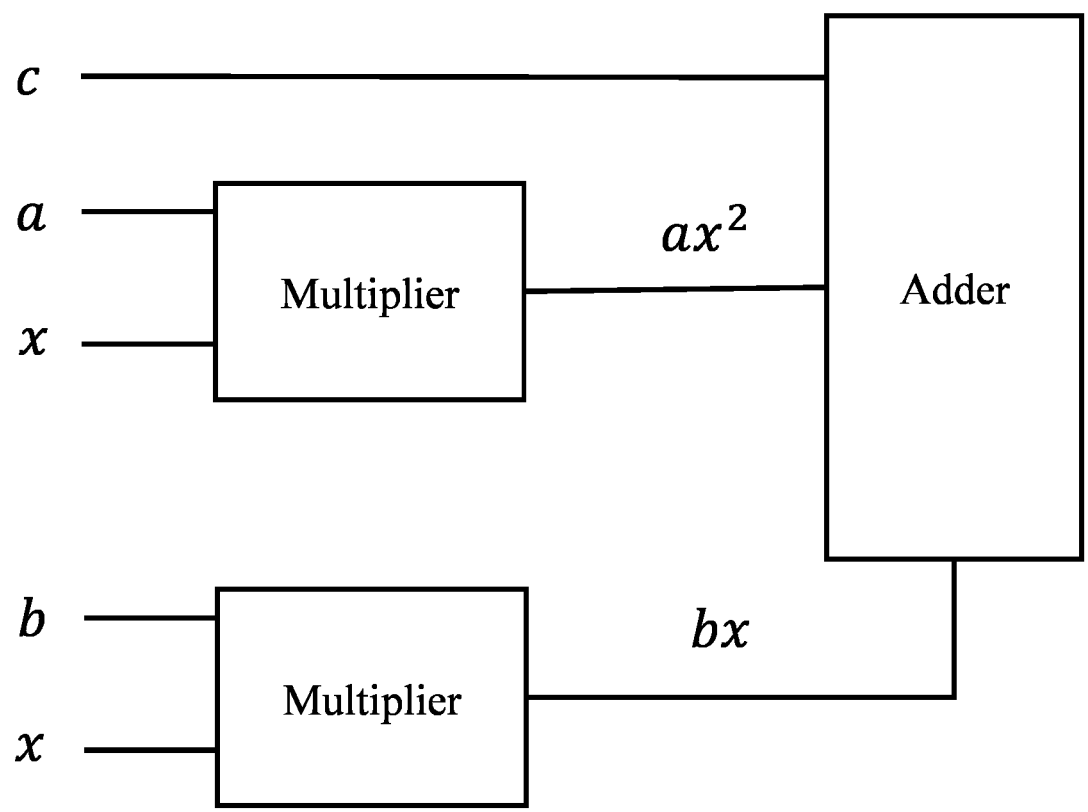
FIG. 4 shows schematic structural diagram of a calculation unit in the device in an embodiment of the present disclosure.

As shown in FIG. 4, the calculation unit 130 includes a multiplier 130 and an adder 131. The multiplier 130 receives the quadratic coefficient a, the first coefficient b, and the input variable x from the selection unit 123, and performs multiplication operations. The adder 131 receives an output result from the multiplier 130 and the constant c from the selection unit 123, and performs addition operations. Then the calculation unit 130 obtains a function value corresponding to the input variable x, which is generally expressed as $f(x)=ax^2+bx+c$.

It should be noted that, in a preferred embodiment, a number of the comparators in each matching unit is equal to a number of the variable intervals. As shown in 2, when the activation function includes N variable intervals, the number of the comparators in each matching unit is also set to N. In the above-mentioned embodiments, the data selector, the comparator, the multiplier, and the adder, etc. can be implemented by general-purpose or special-purpose devices.

Figure 5:
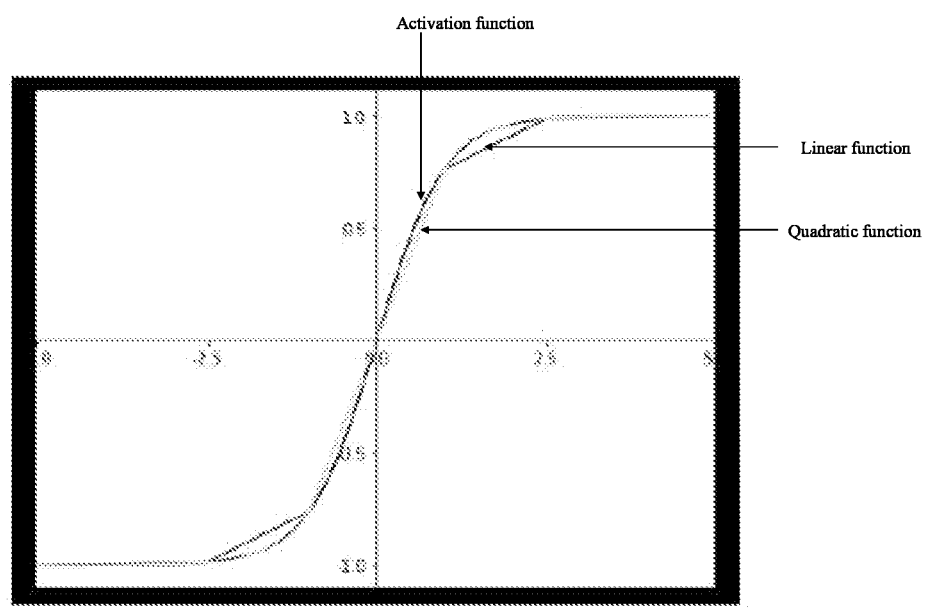
FIG. 5 is an example diagram of an approximation of the activation function by a quadratic function and an approximation of the activation function by a linear function provided in an embodiment of the present disclosure.

In the embodiment, by using a fitted quadratic function to approximate the activation function, compared to a linear function approaching the activation function, any errors generated will be smaller. Taking the activation function of $f(x)=\tanh(x)$ as an example, as shown in FIG. 5, an error of approximating $f(x)=\tanh(x)$ through the fitted quadratic function is reduced by 50%, which is obviously a great improvement on the linear function, which is more suitable for neural network operations.

Figure 6:
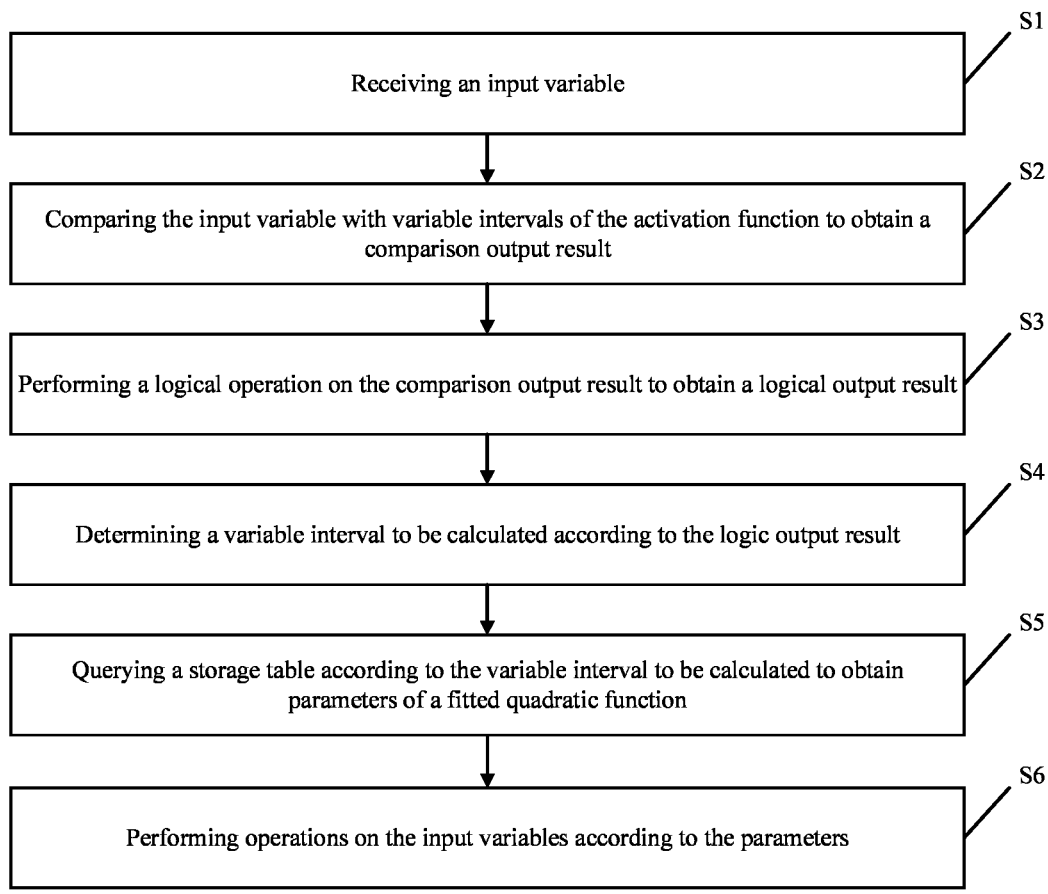
FIG. 6 shows a flowchart of a method for accelerating activation function provided in an embodiment of the present disclosure.

FIG. 6 shows a flowchart of a method for accelerating activation function provided in an embodiment of the present disclosure. According to different needs, the order of the steps in the flowchart can be changed, and some can be omitted. In an embodiment, the method for accelerating activation function is applied to the operation device 10. The method for accelerating activation function may include the following steps.

In block S1, receiving an input variable.

In an embodiment, the input variable is an input variable of an activation function.

In block S2, comparing the input variable with variable intervals of the activation function to obtain a comparison output result.

In an embodiment, the input variable is compared with the variable intervals of the activation function by a comparator in a matching unit to obtain the comparison output result. The comparator is used to compare the input variable of the activation function with the variable intervals of the activation function and determine an output value according to the magnitude relationship between them. When an input variable x is less than a maximum value of an interval variable $x_N$, the comparing unit outputs a low level "0". When the input variable x is greater than or equal to the maximum value of the interval variable $x_N$, the comparing unit outputs a high level "1".

For example, one input of the comparator 2 is used to receive the input variable of the activation function, and the other input is used to receive a maximum value $x_2$ of the interval variable [1,2), and $x_2$ approaches 2. For example, when the input variable is 1.5, since 1.5 is greater than 1, the comparator 1 outputs a high level "1", and since 1.5 is less than 2, the comparator 2 outputs a low level "0". Similarly, since 1.5 is less than a maximum value of other interval variable, other comparator also outputs a low level "0".

In block S3, performing a logical operation on the comparison output result to obtain a logical output result.

In an embodiment, a logic unit in the matching unit performs a logic operation on the comparison output result to obtain the logic output result. The logic unit includes a NOT gate, a plurality of XOR gates, and a buffer unit. For example, as shown in FIG. 3, an output of a comparator 1 is connected to the NOT gate and an XOR gate 1 of the logic unit; an output of a comparator 2 is connected to the XOR gate 1 and an XOR gate 2; an output of a comparator 3 is connected to the XOR gate 2 and an XOR gate 3, and so on. An output of a comparator N−2 is connected to an XOR gate N−3 and an XOR gate N−2; an output of a comparator N−1 is connected to the XOR gate N−2 and a buffer unit 1222.

For example, when the input variable is 1.5, the comparator 1 outputs a low level "0" after passing through the NOT gate of the logic unit. After the output of the comparator 1 and the output of the comparator 2 pass through the XOR gate of the logic unit, a high level "1" is output. After the output of the comparator 2 and the output of the comparator 3 pass through the XOR gate of the logic unit, a low level "0" is output, and so on. After the output of the comparator N−2 and the output of the comparator N−1 pass through the XOR gate of the logic unit, a low level "0" is output.

In block S4, determining a variable interval to be calculated according to the logic output result.

In an embodiment, when the logical output result is "1", the variable interval in which one input interval variable of the corresponding comparator is located is the variable interval to be calculated.

For example, when the input variable is 1.5, the comparator 1 outputs a low level "0" after passing through the NOT gate of the logic unit, while the output of the comparator 1 and the output of the comparator 2 output a high level "1" after being processed by the XOR gate of the logic unit. The output of the comparator 2 and the output of the comparator 3 are a low level "0" after being processed by the XOR gate of the logic unit. Then the variable interval [1,2) in which an input interval variable of the comparator 2 is located is the variable interval to be calculated.

In block S5, querying a storage table according to the variable interval to be calculated to obtain parameters of a fitted quadratic function.

In an embodiment, a selection unit queries the storage table according to the variable interval to be calculated to obtain the parameters of the fitted quadratic function. For example, the selection unit selects parameters ($a_2$, $b_2$, $c_2$) of the fitted quadratic function corresponding to the variable interval [1,2). The parameters selected by the selection unit are then output to a connected calculation unit.

In block S6, performing operations on the input variables according to the parameters.

The calculation unit substitutes the parameters ($a_2$, $b_2$, $c_2$) into a fitted quadratic function $f(x)=a_2x^2+b_2x+c_2$ to complete the calculation for the input variable.

Figure 7:
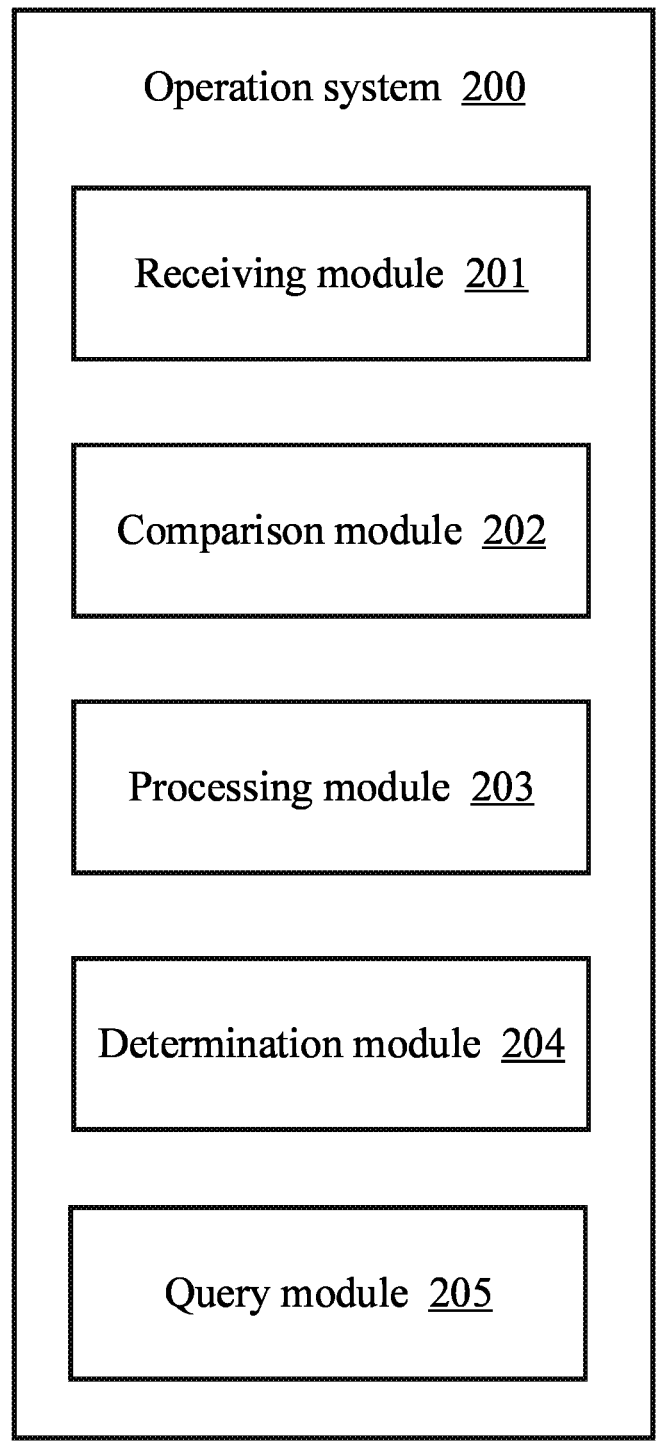
FIG. 7 shows a functional block diagram of a system for accelerating activation function provided in an embodiment of the present disclosure.

FIG. 7 shows a schematic structural diagram of a system for accelerating activation function provided in the embodiment of the present disclosure.

In some embodiments, a system for accelerating activation function runs in an electronic device 1. For the convenience of description, the system for accelerating activation function is referred to as "operation system 200" in the following. The operation system 200 can include a plurality of function modules consisting of program code segments. The program code of each program code segments in the operation system 200 can be stored in a memory and executed by at least one processor to perform accelerating activation function.

As shown in FIG. 7, the operation system 200 can include: a receiving module 201, a comparison module 202, a processing module 203, a determination module 204, and a query module 205. A module as referred to in the present disclosure refers to a series of computer-readable instruction segments that can be executed by at least one processor and that are capable of performing fixed functions, which are stored in a memory.

The above-mentioned integrated unit implemented in a form of software functional modules can be stored in a non-transitory readable storage medium. The above software function modules are stored in a storage medium and includes several instructions for causing an electronic device (which can be a personal computer, a dual-screen device, or a network device) or a processor to execute the method described in various embodiments in the present disclosure.

The receiving module 201 receives an input variable.

In an embodiment, the input variable is an input variable of an activation function.

The comparison module 202 compares the input variable with variable intervals of the activation function to obtain a comparison output result.

In an embodiment, the input variable is compared with the variable intervals of the activation function by a comparator in a matching unit to obtain the comparison output result. The comparator is used to compare the input variable of the activation function with the variable intervals of the activation function and determine an output value according to the magnitude relationship between them. When an input variable x is less than a maximum value of an interval variable $x_N$, the comparing unit outputs a low level "0". When the input variable x is greater than or equal to the maximum value of the interval variable $x_N$, the comparing unit outputs a high level "1".

For example, one input of the comparator 2 is used to receive the input variable of the activation function, and the other input is used to receive a maximum value $x_2$ of the interval variable [1,2), and $x_2$ approaches 2. For example, when the input variable is 1.5, since 1.5 is greater than 1, the comparator 1 outputs a high level "1", and since 1.5 is less than 2, the comparator 2 outputs a low level "0". Similarly, since 1.5 is less than a maximum value of other interval variable, other comparator also output a low level "0".

The processing module 203 performs a logical operation on the comparison output result to obtain a logical output result.

In an embodiment, a logic unit in the matching unit performs a logic operation on the comparison output result to obtain the logic output result. The logic unit includes a NOT gate, a plurality of XOR gates, and a buffer unit. For example, as shown in FIG. 3, an output of a comparator 1 is connected to the NOT gate and an XOR gate 1 of the logic unit; an output of a comparator 2 is connected to the XOR gate 1 and an XOR gate 2; an output of a comparator 3 is connected to the XOR gate 2 and an XOR gate 3; and so on. An output of a comparator N−2 is connected to an XOR gate N−3 and an XOR gate N−2 and an output of a comparator N−1 is connected to the XOR gate N−2 and a buffer unit 1222.

For example, when the input variable is 1.5, the comparator 1 outputs a low level "0" after passing through the NOT gate of the logic unit. After the output of the comparator 1 and the output of the comparator 2 pass through the XOR gate of the logic unit, a high level "1" is output. After the output of the comparator 2 and the output of the comparator 3 pass through the XOR gate of the logic unit, a low level "0" is output, and so on. After the output of the comparator N−2 and the output of the comparator N−1 pass through the XOR gate of the logic unit, a low level "0" is output.

The determination module 204 determines a variable interval to be calculated according to the logic output result.

In an embodiment, when the logical output result is "1", the variable interval in which one input interval variable of the corresponding comparator is located is the variable interval to be calculated.

For example, when the input variable is 1.5, the comparator 1 outputs a low level "0" after passing through the NOT gate of the logic unit, while the output of the comparator 1 and the output of the comparator 2 output a high level "1" after being processed by the XOR gate of the logic unit. The output of the comparator 2 and the output of the comparator 3 are a low level "0" after being processed by the XOR gate of the logic unit. Then the variable interval [1,2) in which an input interval variable of the comparator 2 is located is the variable interval to be calculated.

The query module 205 queries a storage table according to the variable interval to be calculated to obtain parameters of a fitted quadratic function.

In an embodiment, a selection unit queries the storage table according to the variable interval to be calculated to obtain the parameters of the fitted quadratic function. For example, the selection unit selects parameters ($a_2$, $b_2$, $c_2$) of the fitted quadratic function corresponding to the variable interval [1,2). The parameters selected by the selection unit are then output to a connected calculation unit.

The processing module 203 performs operations on the input variables according to the parameters.

The calculation unit substitutes the parameters ($a_2$, $b_2$, $c_2$) into a fitted quadratic function $f(x)=a_2x^2+b_2x+c_2$ to complete the calculation for the input variable.

The embodiment also provides a non-transitory readable storage medium having computer-readable instructions stored therein. The computer-readable instructions are executed by a processor to implement the steps in the above-mentioned image processing method, such as in steps in blocks S1-S6 shown in FIG. 6:

In block S1, receiving an input variable;

In block S2, comparing the input variable with variable intervals of the activation function to obtain a comparison output result;

In block S3, performing a logical operation on the comparison output result to obtain a logical output result;

In block S4, determining a variable interval to be calculated according to the logic output result;

In block S5, querying a storage table according to the variable interval to be calculated to obtain parameters of a fitted quadratic function;

In block S6, performing operations on the input variables according to the parameters.

The computer-readable instructions are executed by the processor to realize the functions of each module/unit in the above-mentioned device embodiments, such as the modules 201-205 in FIG. 7:

The receiving module 201 receives an input variable;

The comparison module 202 compares the input variable with variable intervals of the activation function to obtain a comparison output result;

The processing module 203 performs a logical operation on the comparison output result to obtain a logical output result;

The determination module 204 determines a variable interval to be calculated according to the logic output result;

The query module 205 queries a storage table according to the variable interval to be calculated to obtain parameters of a fitted quadratic function;

The processing module 203 performs operations on the input variables according to the parameters.

Figure 8:
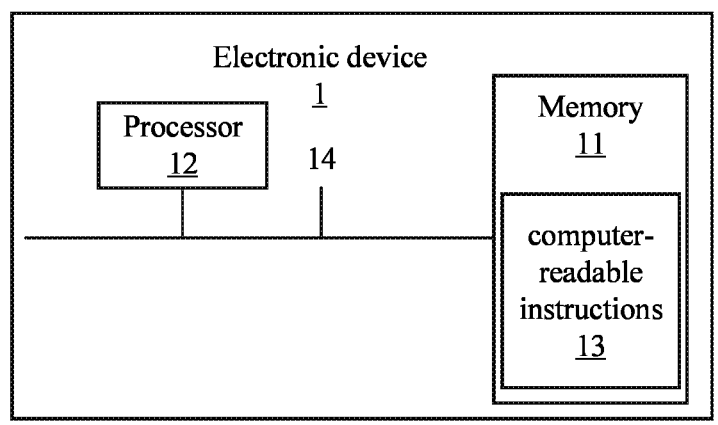
FIG. 8 shows a schematic structural diagram of an electronic device provided in an embodiment of the present disclosure.

FIG. 8 is a schematic structural diagram of an electronic device provided in an embodiment of the present disclosure. The electronic device 1 may include: a memory 11, at least one processor 12, computer-readable instructions 13 stored in the memory 11 and executable on the at least one processor 12, for example, accelerating activation function programs, and at least one communication bus 14. The processor 12 executes the computer-readable instructions to implement the steps in the embodiment of the image processing method, such as in steps in block S1-S6 shown in FIG. 6. Alternatively, the processor 12 executes the computer-readable instructions to implement the functions of the modules/units in the foregoing device embodiments, such as the modules 201-205 in FIG. 7.

For example, the computer-readable instructions can be divided into one or more modules/units, and the one or more modules/units are stored in the memory 11 and executed by the at least one processor 12. The one or more modules/units can be a series of computer-readable instruction segments capable of performing specific functions, and the instruction segments are used to describe execution processes of the computer-readable instructions in the electronic device 1. For example, the computer-readable instruction can be divided into the receiving module 201, the comparison module 202, the processing module 203, the determination module 204, and the query module 205 as in FIG. 7.

The electronic device 1 can be an electronic device such as a desktop computer, a notebook, a palmtop computer, and a cloud server. Those skilled in the art will understand that the schematic diagram 8 is only an example of the electronic device 1 and does not constitute a limitation on the electronic device 1. Another electronic device 1 may include more or fewer components than shown in the figures or other examples may combine some components or have different components. For example, the electronic device 1 may further include an input/output device, a network access device, a bus, and the like.

The at least one processor 12 can be a central processing unit (CPU), or can be another general-purpose processor, digital signal processor (DSPs), application-specific integrated circuit (ASIC), Field-Programmable Gate Array (FPGA), another programmable logic device, discrete gate, transistor logic device, or discrete hardware component, etc. The processor 12 can be a microprocessor or any conventional processor. The processor 12 is a control center of the electronic device 1 and connects various parts of the entire electronic device 1 by using various interfaces and lines.

The memory 11 can be configured to store the computer-readable instructions and/or modules/units. The processor 12 may run or execute the computer-readable instructions and/or modules/units stored in the memory 11 and may call up data stored in the memory 11 to implement various functions of the electronic device 1. The memory 11 mainly includes a storage program area and a storage data area. The storage program area may store an operating system, and an application program required for at least one function (such as a sound playback function, an image playback function, etc.), etc. The storage data area may store data (such as audio data, phone book data, etc.) created according to the use of the electronic device 1. In addition, the memory 11 may include a high-speed random access memory, and may also include a non-transitory storage medium, such as a hard disk, an internal memory, a plug-in hard disk, a smart media card (SMC), a secure digital (SD) Card, a flashcard, at least one disk storage device, a flash memory device, or another non-transitory solid-state storage device.

When the modules/units integrated into the electronic device 1 are implemented in the form of software functional units having been sold or used as independent products, they can be stored in a non-transitory readable storage medium. Based on this understanding, all or part of the processes in the methods of the above embodiments implemented by the present disclosure can also be completed by related hardware instructed by computer-readable instructions. The computer-readable instructions can be stored in a non-transitory readable storage medium. The computer-readable instructions, when executed by the processor, may implement the steps of the foregoing method embodiments. The computer-readable instructions include computer-readable instruction codes, and the computer-readable instruction codes can be in a source code form, an object code form, an executable file, or some intermediate form. The non-transitory readable storage medium can include any entity or device capable of carrying the computer-readable instruction code, such as a recording medium, a U disk, a mobile hard disk, a magnetic disk, an optical disk, a computer memory, or a read-only memory (ROM).

In the several embodiments provided in the preset application, the disclosed electronic device and method can be implemented in other ways. For example, the embodiments of the devices described above are merely illustrative. For example, divisions of the units are only logical function divisions, and there can be other manners of division in actual implementation.

In addition, each functional unit in each embodiment of the present disclosure can be integrated into one processing unit, or can be physically present separately in each unit or two or more units can be integrated into one unit. The above modules can be implemented in a form of hardware or in a form of a software functional unit.

The present disclosure is not limited to the details of the above-described exemplary embodiments, and the present disclosure can be embodied in other specific forms without departing from the spirit or essential characteristics of the present disclosure. Therefore, the present embodiments are to be considered as illustrative and not restrictive, and the scope of the present disclosure is defined by the appended claims. All changes and variations in the meaning and scope of equivalent elements are included in the present disclosure. Any reference sign in the claims should not be construed as limiting the claim. Furthermore, the word "comprising" does not exclude other units nor does the singular exclude the plural. A plurality of units or devices stated in the system claims may also be implemented by one unit or device through software or hardware. Words such as "first" and "second" are used to indicate names, but not in any particular order.

Finally, the above embodiments are only used to illustrate technical solutions of the present disclosure and are not to be taken as restrictions on the technical solutions. Although the present disclosure has been described in detail with reference to the above embodiments, those skilled in the art should understand that the technical solutions described in one embodiment can be modified, or some of the technical features can be equivalently substituted, and that these modifications or substitutions are not to detract from the essence of the technical solutions or from the scope of the technical solutions of the embodiments of the present disclosure.

What is claimed is:

1. A device for accelerating activation function, the device comprising:
   a register for storing a storage table, wherein the storage table stores a mapping relationship between variable intervals of an activation function and parameters of a fitted quadratic function;
   a matching unit comprising a plurality of comparators, a logic unit, and a selection unit, the plurality of comparators are connected to the selection unit through the logic unit, and the plurality of comparators compares an input variable of the activation function with the variable intervals of the activation function to obtain a comparison output result, the logic unit performs a logical operation according to the comparison output result to obtain a logic output result, and determines a variable interval to be calculated according to the logic output result; the selection unit queries the storage table according to the variable interval to be calculated and obtains the parameters of the fitted quadratic function;
   a calculation unit connected to the matching unit and performs calculations on the input variable according to the parameters.

2. The device for accelerating activation function according to claim 1, the logic unit comprising a NOT gate, a plurality of XOR gates, and a buffer unit.

3. The device for accelerating activation function according to claim 1, the parameters of the fitted quadratic function comprising a quadratic coefficient, a first coefficient, and a constant.

4. The device for accelerating activation function according to claim 3, the calculation unit comprising a multiplier and an adder, wherein the multiplier receives the quadratic coefficient, the first coefficient and the input variable from the selection unit, and performs multiplication operations, the adder receives an output result from the multiplier and the constant from the selection unit, and performs addition operations.

5. The device for accelerating activation function according to claim 1, wherein the comparator outputs a low level, when the input variable is less than a maximum variable in the variable intervals; the comparator outputs a high level, when the input variable is greater than or equal to the maximum variable in the variable intervals.

6. The device for accelerating activation function according to claim 1, the activation function comprising a function $$f(x) = \frac{1}{1+e^{-x}},$$

a function $f(x)=\tanh(x)$, a ReLU function $f(x)=\max(0,x)$.

7. The device for accelerating activation function according to claim 1, the register comprising a coefficient register, a segment register and a configuration register, wherein the coefficient register stores the parameters of the fitted quadratic function, when the activation function is divided into N segments, the coefficient register stores N groups of parameters, the segment register stores variables of the activation function after segmentation processing, the configuration register configures the fitted quadratic function to apply various types of activation functions.

8. A method for accelerating activation function, the method comprising:
  receiving an input variable;
  comparing the input variable with variable intervals of an activation function to obtain a comparison output result;
  performing a logical operation on the comparison output result to obtain a logical output result;
  determining a variable interval to be calculated according to the logic output result;
  querying a storage table according to the variable interval to be calculated to obtain parameters of a fitted quadratic function;
    performing operations on the input variables according to the parameters.

9. The method for accelerating activation function according to claim 8, wherein the storage table stores a mapping relationship between the variable intervals of the activation function and parameters of the fitted quadratic function.

10. The method for accelerating activation function according to claim 8, wherein the input variable is compared with the variable intervals of the activation function by a comparator in a matching unit to obtain the comparison output result, and the logic operation on the comparison output result is performed by a logic unit in the matching unit to obtain the logic output result.

11. The method for accelerating activation function according to claim 10, wherein the parameters are substituted by a calculation unit into the fitted quadratic function to perform calculation for the input variable.

12. The method for accelerating activation function according to claim 11, the calculation unit comprising a multiplier and an adder, wherein the multiplier receives a quadratic coefficient, a first coefficient and the input variable from a selection unit, and performs multiplication operations, the adder receives an output result from the multiplier and a constant from the selection unit, and performs addition operations.

13. The method for accelerating activation function according to claim 12, wherein the comparator outputs a low level, when the input variable is less than a maximum variable in the variable intervals; the comparator outputs a high level, when the input variable is greater than or equal to the maximum variable in the variable intervals.

14. The method for accelerating activation function according to claim 8, the activation function comprising a function $$f(x) = \frac{1}{1+e^{-x}},$$

a function $f(x)=\tanh(x)$, a ReLU function $f(x)=\max(0,x)$, the parameters of the fitted quadratic function comprising a quadratic coefficient, a first coefficient, and a constant.

15. A non-transitory storage medium having stored thereon at least one computer-readable instructions that, when the at least one computer-readable instructions are executed by a processor to implement the following steps:
  receiving an input variable;
  comparing the input variable with variable intervals of an activation function to obtain a comparison output result;
  performing a logical operation on the comparison output result to obtain a logical output result;
  determining a variable interval to be calculated according to the logic output result;
  querying a storage table according to the variable interval to be calculated to obtain parameters of a fitted quadratic function;
  performing operations on the input variables according to the parameters.

16. The non-transitory storage medium according to claim 15, wherein the storage table stores a mapping relationship between the variable intervals of the activation function and parameters of the fitted quadratic function.

17. The non-transitory storage medium according to claim 15, wherein the input variable is compared with the variable intervals of the activation function by a comparator in a matching unit to obtain the comparison output result, and the logic operation on the comparison output result is performed by a logic unit in the matching unit to obtain the logic output result.

18. The non-transitory storage medium according to claim 17, wherein the parameters are substituted by a calculation unit into the fitted quadratic function to perform calculation for the input variable.

19. The non-transitory storage medium according to claim 18, the calculation unit comprising a multiplier and an adder, wherein the multiplier receives a quadratic coefficient, a first coefficient and the input variable from a selection unit, and performs multiplication operations, the adder receives an output result from the multiplier and a constant from the selection unit, and performs addition operations.

20. The non-transitory storage medium according to claim 19, wherein the comparator outputs a low level, when the input variable is less than a maximum variable in the variable intervals; the comparator outputs a high level, when the input variable is greater than or equal to the maximum variable in the variable intervals.

* * * * *